United States Patent
Salimath et al.

(10) Patent No.: US 12,361,996 B1
(45) Date of Patent: Jul. 15, 2025

(54) SYSTEM AND METHOD FOR SPIN ORBIT TORQUE BASED MEMORY DEVICE

(71) Applicant: Ceremorphic, Inc., San Jose, CA (US)

(72) Inventors: Akshaykumar Salimath, Hyderabad (IN); Sanghamitra Debroy, Hyderabad (IN); Venkat Mattela, San Jose, CA (US)

(73) Assignee: Ceremorphic, Inc., San Jose, CA (US)

( * ) Notice: Subject to any disclaimer, the term of this patent is extended or adjusted under 35 U.S.C. 154(b) by 245 days.

(21) Appl. No.: 18/201,057

(22) Filed: May 23, 2023

(51) Int. Cl.
*G11C 11/18* (2006.01)
*G11C 11/16* (2006.01)

(52) U.S. Cl.
CPC ........ *G11C 11/161* (2013.01); *G11C 11/1673* (2013.01); *G11C 11/1675* (2013.01); *G11C 11/18* (2013.01)

(58) Field of Classification Search
CPC .............. G11C 11/161; G11C 11/1673; G11C 11/1675; G11C 11/18
See application file for complete search history.

(56) References Cited

U.S. PATENT DOCUMENTS

| | | | | |
|---|---|---|---|---|
| 2011/0044099 | A1* | 2/2011 | Dieny | H01F 10/3254 365/171 |
| 2011/0316102 | A1* | 12/2011 | Ohmori | H10N 50/10 257/E29.323 |
| 2018/0277190 | A1* | 9/2018 | Worledge | H10N 50/10 |
| 2018/0374526 | A1* | 12/2018 | Lee | H10N 50/10 |
| 2023/0368840 | A1* | 11/2023 | Mizukami | G11C 11/1675 |

* cited by examiner

*Primary Examiner* — Jay W. Radke
(74) *Attorney, Agent, or Firm* — Minisandram Law Firm; Raghunath S. Minisandram

(57) ABSTRACT

A system and method for a memory device is disclosed. A substrate is provided. A first ferromagnetic layer is disposed over the substrate. A spacer layer is disposed over the first ferromagnetic layer. A second ferromagnetic layer is disposed over the spacer layer and magnetized in a first direction. A first charge current pulse is passed through the substrate, along a direction perpendicular to the first direction and orients the magnetization of the first ferromagnetic layer in a second direction perpendicular to the first direction. A second charge current pulse is passed through the substrate to selectively switch the magnetization of the first ferromagnetic layer either in the first direction or a direction opposite to the first direction based on a direction of the second charge current. The direction of switched orientation of the magnetization of the first ferromagnetic layer indicates a first value or a second value.

16 Claims, 4 Drawing Sheets

SYSTEM AND METHOD FOR SPIN ORBIT TORQUE BASED MEMORY DEVICE

RELATED APPLICATION

None

TECHNICAL FIELD

The present invention relates generally to memory devices and more specifically, to non volatile memory device.

DESCRIPTION OF RELATED ART

Non-volatile spintronics devices such as Magnetic Random Access Memories (MRAM) and racetrack memories are the promising candidates for next generation beyond CMOS memories. These devices are scalable and offer ultra low power and high speed operation with extended endurance and improved reliability. While spin transfer torque (STT) MRAM devices have been commercialized, they suffer from requiring high switching current densities, slower switching times, and oxide barrier reliability issues.

Further, continued requirement for minimal power consumption in computing devices configured to use these devices and utilization of semiconductor technology to construct these devices are desirable for mass adaptation of these devices. With these needs in mind, the current disclosure arises. This brief summary has been provided so that the nature of the disclosure may be understood quickly. A more complete understanding of the disclosure can be obtained by reference to the following detailed description of the various embodiments thereof in connection with the attached drawings.

SUMMARY OF THE INVENTION

In one embodiment, a method is disclosed. A substrate is provided. At least one first ferromagnetic layer is disposed over the substrate. At least one spacer layer is disposed over the first ferromagnetic layer. A second ferromagnetic layer is disposed over the spacer layer. The second ferromagnetic layer is magnetized in a first direction. A first charge current pulse is selectively passed through the substrate, along a direction perpendicular to the first direction to orient the magnetization of the first ferromagnetic layer in a second direction perpendicular to the first direction. A second charge current pulse is selectively passed through the substrate to selectively magnetize the first ferromagnetic layer, wherein a direction of the second charge current pulse switches the orientation of the magnetization of the first ferromagnetic layer to either the first direction or a direction opposite to the first direction, based on a direction of the second charge current, and wherein the direction of switched orientation of the magnetization of the first ferromagnetic layer indicates a first value or a second value.

In another embodiment, a system is disclosed. A substrate is provided. At least one first ferromagnetic layer is disposed over the substrate. At least one spacer layer is disposed over the first ferromagnetic layer. A second ferromagnetic layer is disposed over the spacer layer. The second ferromagnetic layer is magnetized in a first direction. A first charge current pulse is selectively passed through the substrate, along a direction perpendicular to the first direction to orient the magnetization of the first ferromagnetic layer in a second direction perpendicular to the first direction. A second charge current pulse is selectively passed through the substrate to selectively magnetize the first ferromagnetic layer, wherein a direction of the second charge current pulse switches the orientation of the magnetization of the first ferromagnetic layer to either the first direction or a direction opposite to the first direction, based on a direction of the second charge current, and wherein the direction of switched orientation of the magnetization of the first ferromagnetic layer indicates a first value or a second value.

This brief summary is provided so that the nature of the disclosure may be understood quickly. A more complete understanding of the disclosure can be obtained by reference to the following detailed description of the preferred embodiments thereof in connection with the attached drawings.

BRIEF DESCRIPTION OF THE DRAWINGS

The foregoing and other features of several embodiments are described with reference to the drawings. In the drawings, the same components have the same reference numerals. The illustrated embodiments are intended to illustrate but not limit the invention. The drawings include the following figures.

DETAILED DESCRIPTION

To facilitate an understanding of the adaptive aspects of the present disclosure, an example memory device will be described. The specific construction and operation of the adaptive aspects of various elements of the example memory device is described.

Figure 1:
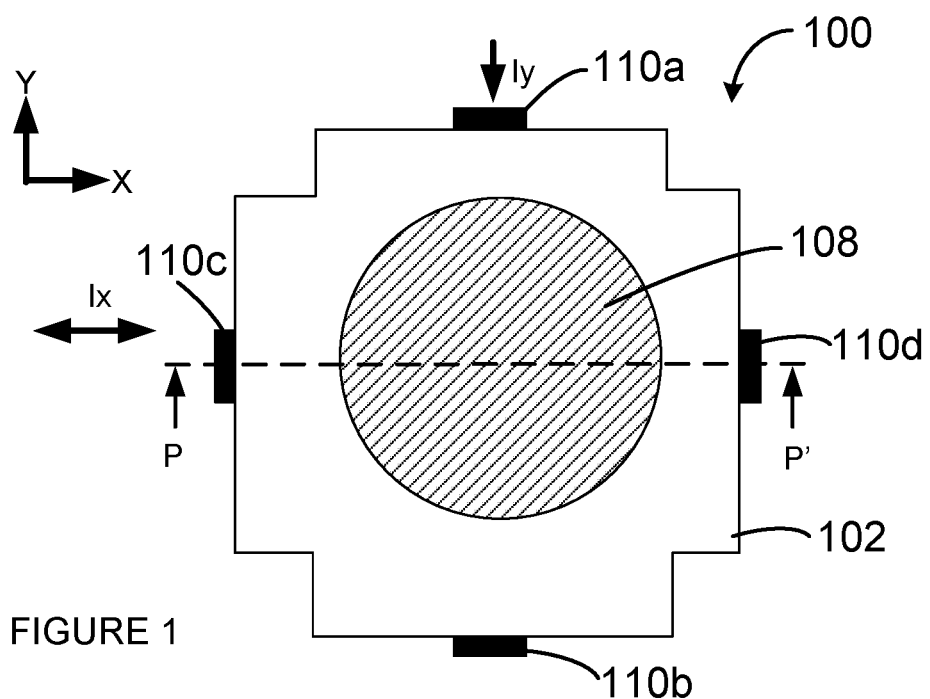
FIGS. 1 and 1A show an example memory device, according to one aspect of the present disclosure.
Figure 1A:
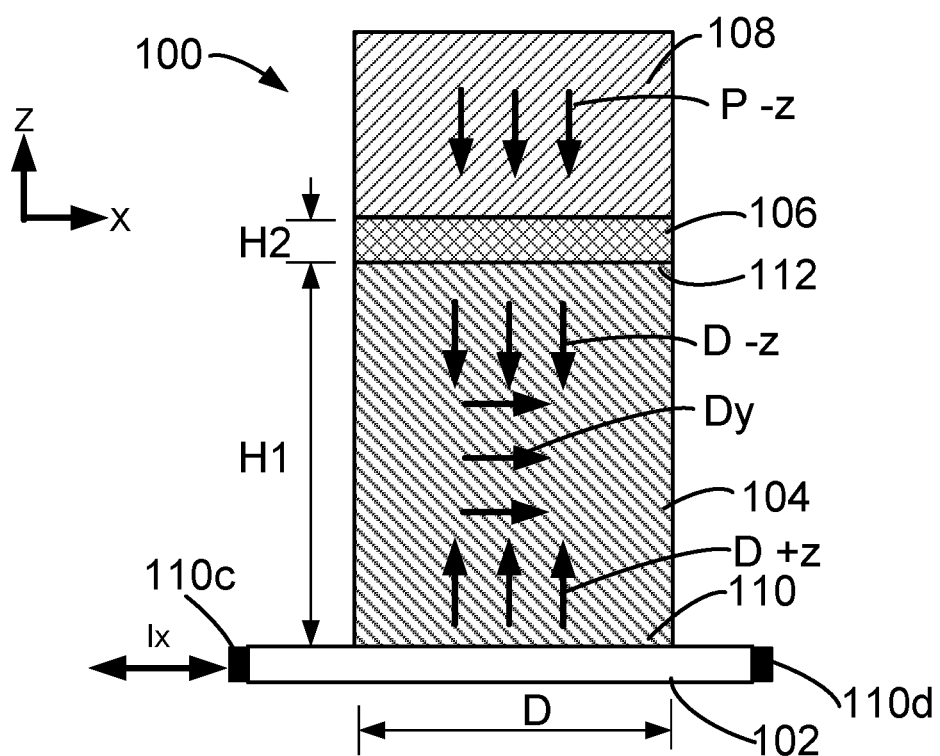

FIG. 1 shows top view of an example memory device 100. FIG. 1A shows cross-sectional view of the memory device 100, along an axis P-P'. Now, referring to FIGS. 1 and 1A, the memory device 100 includes a substrate 102, a first ferromagnetic layer 104, a spacer layer 106, and a second ferromagnetic layer 108. The substrate 102 in one example is a topological insulator. The substrate 102 is substantially made of heavy metal, such as Tantalum (Ta), Platinum (Pt), or Tungsten (W) or an alloy of heavy metal. In one example, the substrate 102 is a layer of thin film with a very large spin hall angle, such as a layer of thin film of Tantalum (Ta), Platinum (Pt), or Tungsten (W) or an alloy of Tantalum (Ta), Platinum (Pt), or Tungsten (W). The substrate 102 is configured to receive a charge current and convert the charge current into a spin current, through spin Hall effect. In some examples, substrate 102 may be a topological insulator or one or more stacks of Cobalt/Platinum ((Co/Pt)n) exhibiting large charge to spin conversion ratio. The thickness of the substrate 102 may be of the order of about 5 nm to about 10 nm. The substrate 102 includes a first pair of conductive pads 110a and 110b, and a second pair of conductive pads 110c and 110d. A first charge current Iy may be selectively passed through the substrate 102, using the first pair of conductive pads 110*a* and 110*b*. A second charge current Ix may be selectively passed through the substrate 102, using the second pair of conductive pads 110*c* and 110*d*. In one example, the first charge current Iy is passed along a Y axis and the second charge current Ix is passed along the X axis, perpendicular to the Y axis. Functions and features of the first charge current Iy and the second charge current Ix will be later described in detail. As one skilled in the art appreciates, the substrate 102 may be deposited on a base layer (not shown). In some examples, base layer may be a silicon wafer.

The first ferromagnetic layer 104 is disposed over the substrate 102, for example, along a Z axis, perpendicular to the X axis and Y axis. The first ferromagnetic layer 104 is substantially made of a permalloy, for example, cobalt-iron-boron (CoFeB) alloy. In one example, the first ferromagnetic layer 104 is substantially cylindrical, with a diameter D of about 2.5 nm to about 5 nm. The thickness H1 of the first ferromagnetic layer 104 along the Z axis may be higher than the diameter of the first ferromagnetic layer 104. In some examples, the thickness H1 may be of the order of about 3 nm to about 6 nm. As one skilled in the art appreciates, the dimension of the first ferromagnetic layer 104 is such that the diameter D is less than the thickness H1, thereby providing a shape anisotropy, which will enhance effective anisotropy along Z axis. In other words, the easy axis of the first ferromagnetic layer 104 is along the Z axis and the hard axis of the first ferromagnetic layer 104 is along X axis (or Y axis). The first ferromagnetic layer 104 has a first end 110 abutting the substrate 102 and a second end 112 opposite to the first end 110, away from the substrate 102. The second end 112 of the first ferromagnetic layer 104 abuts the spacer layer 106.

The spacer layer 106 in one example, is substantially made of an insulating tunneling barrier material, for example, Magnesium Oxide (MgO). In some examples, the MgO layer also gives rise to interfacial perpendicular magnetic anisotropy (PMA). A thickness H2 of the spacer layer 106 may be of the order of about 0.5 nm to about 1 nm. The diameter of the spacer layer 106 may be substantially similar to the diameter of the first ferromagnetic layer 104.

The second ferromagnetic layer 108 is disposed over the spacer layer 106. The second ferromagnetic layer 108 is substantially made of a permalloy, for example, cobalt-iron-boron (CoFeB) alloy. In some examples, a suitable cobalt-nickel alloy or other similar materials that provide high magnetic permeability may be used. In one example, the second ferromagnetic layer 108 is substantially cylindrical, with a diameter similar to the diameter of the first ferromagnetic layer 104. The thickness H3 of the second ferromagnetic layer 108 may be of the order of about 1 nm to about 2 nm. The second ferromagnetic layer 108 acts as a pinned or reference layer, whose magnetization is fixed along the Z axis. The magnetization direction of the second ferromagnetic layer 108 in one example is fixed by adjacent synthetic anti-ferromagnetic layer (SAF). In one example, the first ferromagnetic layer 104, the spacer layer 104, and the second ferromagnetic layer 108 are stacked along the Z axis, perpendicular to the X axis and the Y axis.

As previously described, the substrate 102 is configured to selectively receive first charge current Iy and the second charge current Ix. When a charge current is passed through the substrate 102, the spin current (due to spin orbit torque (SOT) effect) at the interface between the substrate 102 and the first ferromagnetic layer 104 switches the magnetization along one of the axes (easy axis or hard axis), based on the direction of the charge current. For example, when the first charge current Iy is passed through the substrate 102, the first ferromagnetic layer 104 is magnetized along the X axis. The direction of magnetization is shown by the arrows Dy. The direction of magnetization shown by the arrows Dy is perpendicular to the direction of magnetization (P −z) in the second ferromagnetic material 108. As previously described, X axis corresponds to the hard axis of the first ferromagnetic layer 104. Similarly, when the second charge current Ix is passed through the substrate 102, the first ferromagnetic layer 104 is magnetized along the + or −Z axis, based on the direction of the second charge current Ix. The direction of magnetization is shown by the arrows D +z or D −z, depending upon the direction of the second charge current Ix. As previously described, Z axis corresponds to the easy axis of the first ferromagnetic layer 104.

In one example, the second ferromagnetic layer 108 is magnetized either in +Z or −Z direction. In this example, the second ferromagnetic layer 108 is magnetized along the −Z direction, as shown by arrows P −z. For example, the second ferromagnetic layer 108 may be advantageously magnetized using an annealing process. The SAF stack on top of the second ferromagnetic layer retains the direction of orientation of the magnetization of the second ferromagnetic layer 108. As the magnetization direction of the second ferromagnetic layer 108 is fixed, it is sometimes referred to as a pinned layer or a reference layer. As the magnetization direction of the first ferromagnetic layer 104 may change between +Z and −Z axis, it is sometimes referred to as a free layer.

As one skilled in the art appreciates, the first ferromagnetic layer 104, the spacer layer 106 and the second ferromagnetic layer 108 together form a magnetic tunnel junction, whose resistance will depend upon the direction of magnetization of the free layer, as compared to the direction of magnetization of the pinned layer. For example, when the direction of magnetization of the pinned layer, for example, the second ferromagnetic layer 108 and the direction of magnetization of the free layer, for example, the first ferromagnetic layer 104, are the same, the resistance of the magnetic tunnel junction will be low. In one example, this low resistance value may be used to define a first value. And, when the direction of magnetization of the pinned layer, for example, the second ferromagnetic layer 108 and the direction of magnetization of the free layer, for example, the first ferromagnetic layer 104, are different, the resistance of the magnetic tunnel junction will be high. In one example, this high resistance value may be used to define a second value. As one skilled in the art appreciates, this feature can be advantageously used to create a memory device to selectively store the first value and the second value.

Figure 2A:
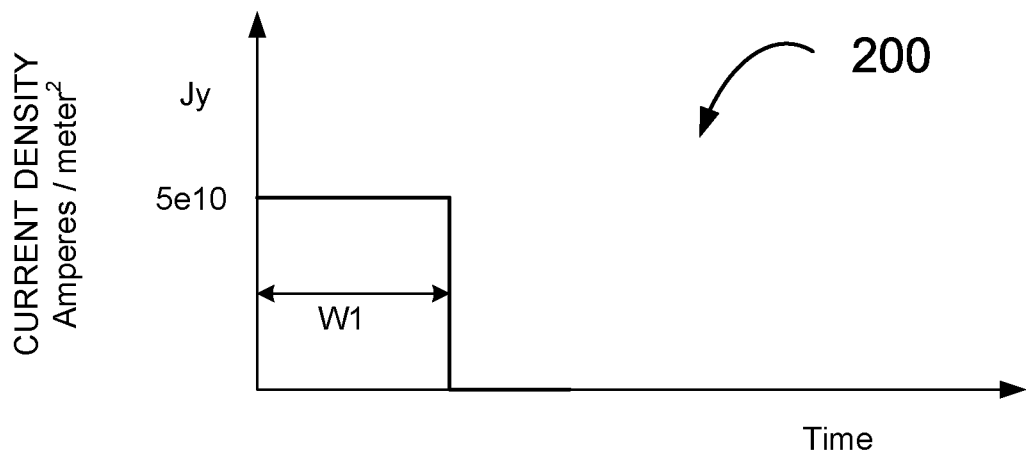
FIG. 2A shows example graph of the first charge current pulse, according to one aspect of the present disclosure.

Having generally described the device 100, now, an example operation of the device 100 will now be described. First, the magnetic direction of the second ferromagnetic layer 108 is pinned to be either in +Z or −Z direction. In this example, the magnetic direction of the second ferromagnetic layer 108 is pinned in the −Z direction. Next, first charge current Iy is passed through the substrate 102, along the Y axis. The first charge current Iy is selectively chosen such that the magnetic orientation of the first ferromagnetic layer 104 is set to be along the hard axis, in this case, along the X axis, as shown by arrows Dy. In one example, the current density Jy for first charge current Iy may be of the order of about 5e10 Amperes/meter$^2$. Further, the pulse width W1 may be of the order of about 0.15 nanoseconds. FIG. 2A shows graph 200 depicting an example first charge current density Jx for first charge current pulse Iy.

Figure 2B:
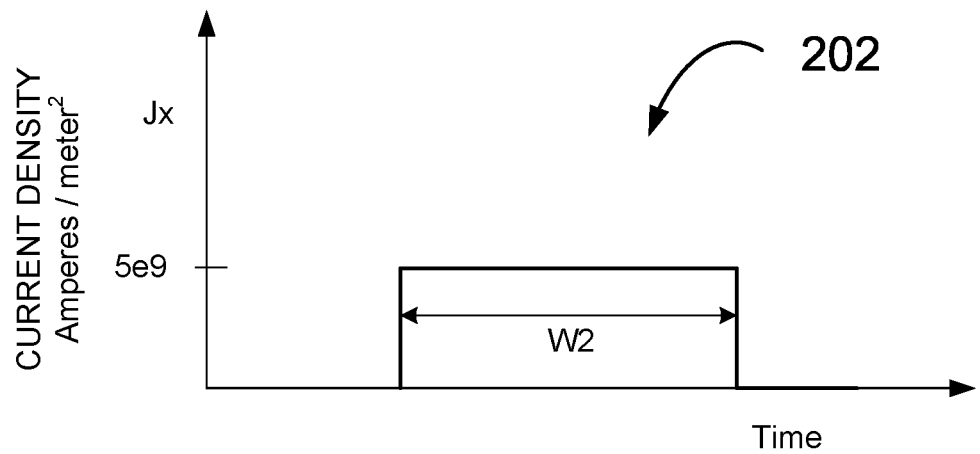
FIG. 2B shows example graph of the second charge current pulse, according to one aspect of the present disclosure.

After orienting the magnetic domains of the first ferromagnetic layer 104 along the hard axis, second charge current Ix is passed through the substrate, along +X or −X axis, based on the input value (either the first value or the second value) to be stored in the device 100. In one example, the current density Jx for second charge current Ix may be of the order of about 5e9 Amperes/meter$^2$. Further, the pulse width W2 of the second charge current Ix may be of the order of about 0.6 nanoseconds. FIG. 2B shows graph 202 depicting an example second charge current density Jx for second chare current Ix. As one skilled in the art appreciates, the second charge current Ix is significantly less than the first charge current Iy, as switching the magnetic domains along the easy axis requires less current than switching the magnetic domain along the hard axis. Also, we notice that the switching speed is in sub-nanosecond range (0.15 nanoseconds for Iy plus 0.60 nanoseconds for Ix, for a total of 0.75 nanoseconds) in this example.

Figure 3A:
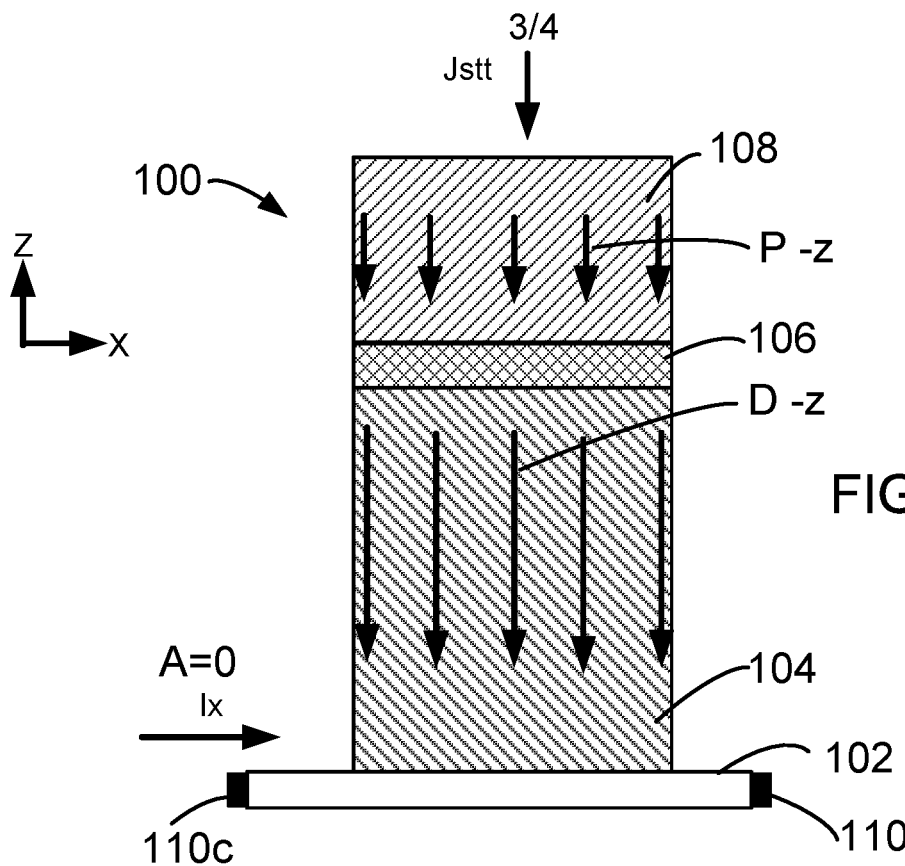
FIGS. 3A, and 3B show reading of the memory device, based on selective magnetization direction of the first ferromagnetic layer, according to one aspect of the present disclosure.

Having described general construction and operation of the memory device 100, example read operation of the memory device 100 will now be described with reference to FIGS. 3A, and 3B. Now, referring to FIG. 3A, the second ferromagnetic layer 108 is magnetized along the −Z direction, as shown by arrows P −z. And, based on a selective direction of flow of second charge current Ix, the first ferromagnetic layer 104 is also magnetized along the −Z direction, as shown by arrows D −z. In this example, the second charge current Ix is flowing from conductive pad 110c to conductive pad 110d. In one example, this may corresponding to an input value of A=0.

A read current Jstt may be advantageously passed through the MTJ stack of first ferromagnetic layer 104, the spacer layer 106, and the second ferromagnetic layer 108 to measure the resistance value of the MTJ stack to determine the stored first value or the second value. Read current Jstt is passed along the −Z direction. As both the first ferromagnetic layer 104 and the second ferromagnetic layer 108 are magnetized in the same direction, for example, in −Z direction, the resistance of the magnetic tunnel junction formed by the first ferromagnetic layer 104, the spacer layer 106 and the second ferromagnetic layer 108 will be low. In some examples, the resistance of the magnetic tunnel junction may be of the order of about 2 kilo ohms. The low resistance in one example will indicate a first value, for example, A=0.

Figure 3B:
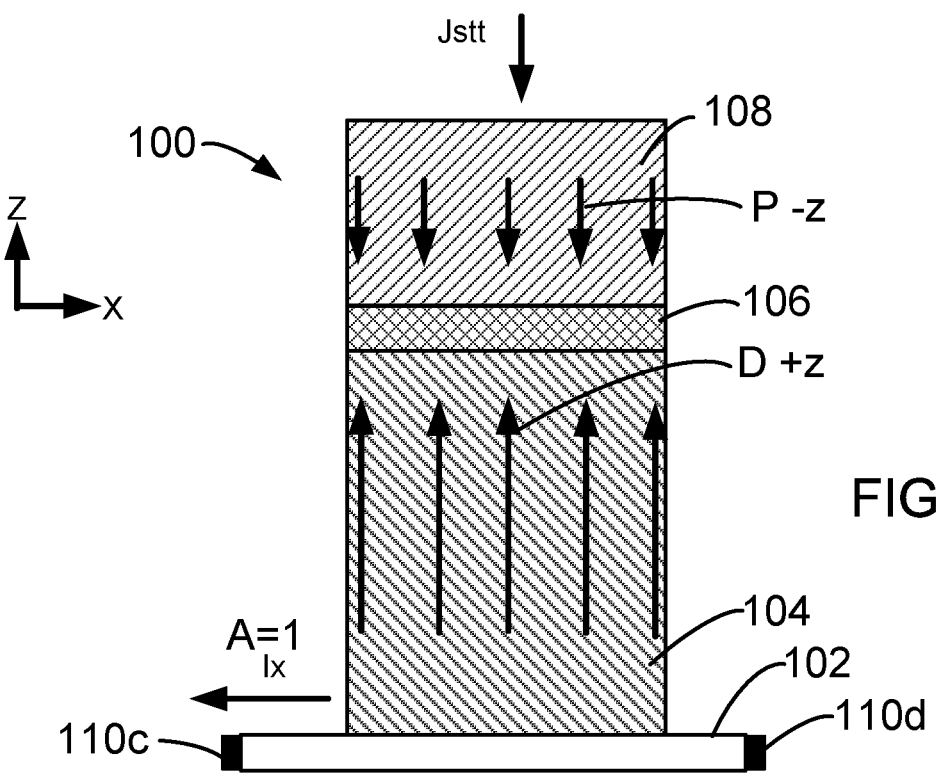

Now, referring to FIG. 3B, the second ferromagnetic layer 108 is magnetized along the −Z direction, as shown by arrows P −z. And, based on a selective direction of flow of second charge current Ix, the first ferromagnetic layer 104 is magnetized along the +Z direction, as shown by arrows D +z. In this example, the second charge current Ix is flowing from conductive pad 110d to conductive pad 110c. In one example, this may corresponding to an input value of A=1.

A read current Jstt may be advantageously passed through the MTJ stack of first ferromagnetic layer 104, the spacer layer 106, and the second ferromagnetic layer 108 to measure the resistance value of the MTJ stack to determine the stored first value or the second value. Read current Jstt is passed along the −Z direction. As magnetization of the first ferromagnetic layer 104 is opposite to the magnetization of the second ferromagnetic layer 108, the resistance of the magnetic tunnel junction formed by the first ferromagnetic layer 104, the spacer layer 106 and the second ferromagnetic layer 108 will be high. In some examples, the resistance of the magnetic tunnel junction may be of the order of about 4 kilo ohms. The high resistance in one example will indicate a second value, for example, A=1.

Figure 4:
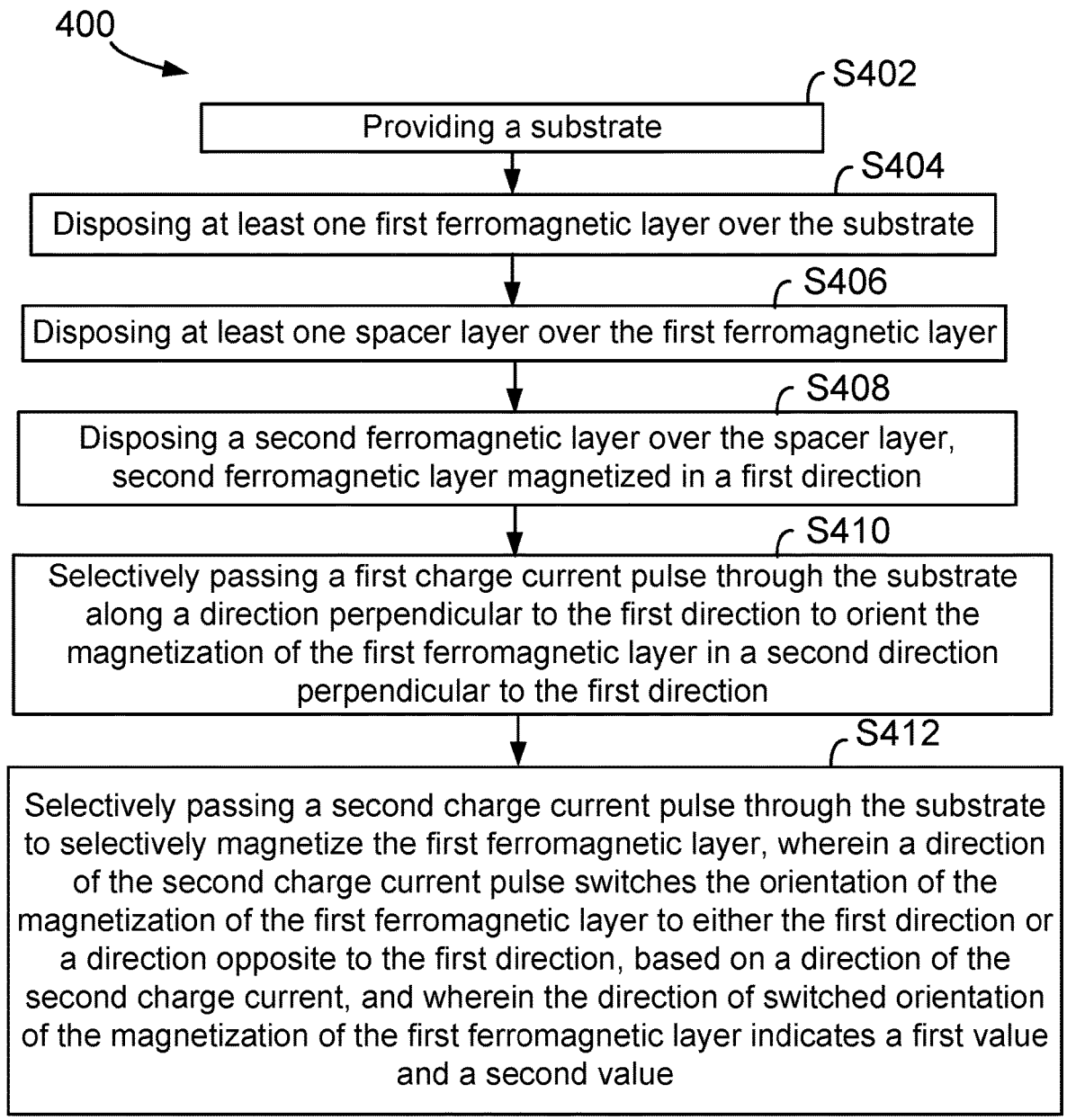
FIG. 4 shows an example flow diagram, according to one aspect of the present disclosure.

Now, referring to FIG. 4, an example flow diagram 400 is described. In block S402, a substrate is provided. For example, substrate 102 is provided.

In block S404, at least one first ferromagnetic layer is disposed over the substrate. For example, the first ferromagnetic layer 104 is disposed over the substrate 102.

In block S406, at least one spacer layer is disposed over the first ferromagnetic layer. For example, the spacer layer 106 is disposed over the first ferromagnetic layer 104.

In block S408, a second ferromagnetic layer is disposed over the spacer layer, the second ferromagnetic layer magnetized in a first direction. For example, second ferromagnetic layer 108 is disposed over the spacer layer 106. The second ferromagnetic layer 108 is magnetized along the −Z direction, as previously described with reference to FIGS. 1 and 1A.

In block S410, a first charge current pulse is selectively passed through the substrate along a direction perpendicular to the first direction to orient the magnetization of the first ferromagnetic layer in a second direction perpendicular to the first direction. For example, a first charge current Iy is passed along the Y axis, to orient the magnetization of the first ferromagnetic layer along the X axis. The orientation of the magnetization of the first ferromagnetic layer 104 was previously described with reference to FIGS. 1 and 1A.

In block S412, a second charge current pulse is selectively passed through the substrate to selectively magnetize the first ferromagnetic layer, wherein a direction of the the second charge current pulse switches the orientation of the magnetixation of the first ferromagnetic layer to either the first direction or a direction opposite to the first direction, based on a direction of the second charge current, and wherein the direction of the switched orientation of the magnetization of the first ferromagnetic layer indicates a first value or a second value. For example, a second charge current pulse Ix is passed through the substrate, as previously described with reference to FIGS. 1 and 1A. The orientation of the magnetization of the first ferromagnetic layer 104 changes based on the direction of the second charge current pulse Ix, as previously described with reference to FIGS. 1 and 1A.

As one skilled in the art appreciates, example magnetic device 100 of FIG. 1 may be used as a single bit register, memory cell, or an inverter, to selectively switch the magnetization of the first ferromagnetic layer 104 between a value of 0 and 1.

In some examples, there can be a plurality of sub-stacks of first ferromagnetic layer and the spacer layer stacked over each other, for example, along the Z axis. One of the advantages of stacking a plurality of sub-stacks of first ferromagnetic layer and the spacer layer is better thermal stability. As one skilled in the art appreciates, in this example construction, the perpendicular anisotropy based memory device by using spin orbit torque (SOT) effect provides faster switching speeds, as compared to a longitudinal anisotropy based memory device, for example, a memory device using spin transfer torque (STT) effect. In some examples, sub-nanosecond switching speeds can be achieved in the memory device using the SOT effect. Further, charge current density required to switch the orientation of magnetization in the first ferromagnetic material may be achieved in the range of about 5e10 Amperes/meter$^2$ which corresponds to the charge current density Jy of first charge current Iy which is higher than the charge current density Jx for the second charge current Ix. The switching current is scalable in the example device, as much smaller current densities are possible using heavy metal layer with large charge to spin conversion. Due to negligible incubation time, required due to the nature of the SOT effect, sub-nanosecond switching is possible in the example device.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that phraseology or terminology employed herein is for the purpose of description and not of limitation.

While embodiments of the present invention are described above with respect to what is currently considered its preferred embodiments, it is to be understood that the invention is not limited to that described above. To the contrary, the invention is intended to cover various modifications and equivalent arrangements within the spirit and scope of the appended claims.

What is claimed is:

1. A method, including:
providing a substrate;
disposing at least one first ferromagnetic layer over the substrate;
disposing at least one spacer layer over the first ferromagnetic layer;
disposing a second ferromagnetic layer over the spacer layer, the second ferromagnetic layer magnetized in a first direction;
selectively passing a first charge current pulse through the substrate along a direction perpendicular to the first direction to orient the magnetization of the first ferromagnetic layer in a second direction perpendicular to the first direction;
selectively passing a second charge current pulse through the substrate to selectively magnetize the first ferromagnetic layer,
wherein a direction of the second charge current switches the orientation of the magnetization of the first ferromagnetic layer from the second direction to either the first direction or a direction opposite to the first direction, based on a direction of the second charge current, and
wherein the direction of switched orientation of the magnetization of the first ferromagnetic layer indicates a first value or a second value.

2. The method of claim 1, further including, selectively passing a read current through the first ferromagnetic layer, the spacer layer, and the second ferromagnetic layer to determine the switched orientation of the magnetization of the first ferromagnetic layer.

3. The method of claim 1, wherein, the substrate is disposed along a first axis and a second axis perpendicular to the first axis, and wherein, the first ferromagnetic layer, the spacer layer, and the second ferromagnetic layer are disposed along a third axis perpendicular to the first axis and the second axis.

4. The method of claim 3, wherein, a height of the first ferromagnetic layer is greater than a width of the first ferromagnetic layer, resulting in a magnetic easy axis along the third axis.

5. The method of claim 1, wherein, a diameter of the first ferromagnetic layer is of the order of about 2.5 nm to about 5 nm.

6. The method of claim 5, wherein a height of the first ferromagnetic layer is of the order of about 3 nm to about 6 nm.

7. The method of claim 1, wherein a charge current density of the first charge current is of the order of about $5e10$ amperes/meter$^2$ to about $1.5e10$ amperes/meter$^2$.

8. The method of claim 1, wherein a charge current density of the second charge current is of the order of about $5e9$ amperes/meter$^2$ to about $1.5e9$ amperes/meter$^2$.

9. A system, including:
a substrate;
at least one first ferromagnetic layer disposed over the substrate;
at least one spacer layer disposed over the first ferromagnetic layer;
a second ferromagnetic layer disposed over the spacer layer, the second ferromagnetic layer magnetized in a first direction;
a first charge current pulse is selectively passed through the substrate along a direction perpendicular to the first direction to orient the magnetization of the first ferromagnetic layer in a second direction perpendicular to the first direction;
a second charge current pulse is selectively passed through the substrate to selectively magnetize the first ferromagnetic layer,
wherein a direction of the second charge current switches the orientation of the magnetization of the first ferromagnetic layer from the second direction to either the first direction or a direction opposite to the first direction, based on a direction of the second charge current, and
wherein the direction of switched orientation of the magnetization of the first ferromagnetic layer indicates a first value or a second value.

10. The system of claim 9, wherein, a read current is passed through the first ferromagnetic layer, the spacer layer, and the second ferromagnetic layer to determine the switched orientation of the magnetization of the first ferromagnetic layer.

11. The system of claim 9, wherein, the substrate is disposed along a first axis and a second axis perpendicular to the first axis, and wherein, the first ferromagnetic layer, the spacer layer, and the second ferromagnetic layer are disposed along a third axis perpendicular to the first axis and the second axis.

12. The system of claim 11, wherein, a height of the first ferromagnetic layer is greater than a width of the first ferromagnetic layer, resulting in a magnetic easy axis along the third axis.

13. The system of claim 9, wherein, a diameter of the first ferromagnetic layer is of the order of about 2.5 nm to about 5 nm.

14. The system of claim 13, wherein a height of the first ferromagnetic layer is of the order of about 3 nm to about 5 nm.

15. The system of claim 9, wherein a current density of the first charge current is of the order of $5e10$ amperes/meter$^2$ to about $1.5e10$ amperes/meter$^2$.

16. The system of claim 9, wherein a current density of the second change current is of the order of about $5e9$ amperes/meter$^2$ to about $1.5e9$ amperes/meter$^2$.

* * * * *